United States Patent [19]

Sone

[11] Patent Number: 5,396,191
[45] Date of Patent: Mar. 7, 1995

[54] HIGH GAIN DIFFERENTIAL AMPLIFIER CAPABLE OF REDUCING OFFSET VOLTAGE

[75] Inventor: Kazuya Sone, Tokyo, Japan
[73] Assignee: NEC Corporation, Tokyo, Japan
[21] Appl. No.: 258,226
[22] Filed: Jun. 10, 1994

[30] Foreign Application Priority Data

Jun. 15, 1993 [JP] Japan .................. 5-143894

[51] Int. Cl.⁶ ............................... H03F 3/45
[52] U.S. Cl. ................... 330/253; 330/257; 330/261
[58] Field of Search .......... 330/253, 257, 261, 311

[56] References Cited

U.S. PATENT DOCUMENTS 4,661,779 4/1987 Okamoto ............... 330/253

FOREIGN PATENT DOCUMENTS 645844 2/1994 Japan .

*Primary Examiner*—James B. Mullins
*Attorney, Agent, or Firm*—Whitham, Curtis, Whitham & McGinn

[57] ABSTRACT

A high gain differential amplifier including a current mirror circuit, a differential transistor pair having first and second transistors whose gates are connected to first and second input terminals, a first constant-current source connected to common sources of the first and second transistors, and a pair of third and fourth transistors whose gates are coupled, in which the fourth transistor is connected to the first transistor and an output terminal is coupled with a drain of the second transistor. The differential amplifier further includes a fifth transistor whose gate and drain are connected to the drains of the first and fourth transistors and to the output terminal and the drain of the second transistor, respectively, a sixth transistor whose drain and gate are connected to the drain and gate of the third transistor and to a bias power supply terminal, and a second constant-current source connected to the source of the sixth transistor. The addition of the sixth transistor permits a voltage between the drain and source of the third and fourth transistors to be nearly equal. As a result, a drain current ratio between the third and fourth transistors can be precisely determined and thus an input offset voltage can be reduced to nearly zero.

5 Claims, 5 Drawing Sheets

HIGH GAIN DIFFERENTIAL AMPLIFIER CAPABLE OF REDUCING OFFSET VOLTAGE

BACKGROUND OF THE INVENTION

The present invention relates to a differential amplifier having high gain at a low frequency signal input.

DESCRIPTION OF THE RELATED ARTS

As a prior art on the present invention, one differential amplifier has been proposed, as disclosed in Japanese Patent Application No. 4-46476.

FIG. 1 shows a conventional typical differential amplifier. In this case, a pair of FETs (field-effect transistors) M101 and M102 whose sources are coupled with each other in common and whose gates are connected to respective input terminals t1 and t2 constitute a differential transistor pair. One end of a first constant-current source I101 is coupled with the common source connection point of the FETs M101 and M102 and the other end of the first constant-current source I101 is connected to a low power supply terminal t4. The drain and gate of an FET M103 are coupled with each other and the source of the FET M103 is connected to a high power supply terminal t5. The gate of another FET M104 is connected to the gate of the FET M103, and the source to the high power supply terminal t5, and the drain to the drain of the FET M101. The FETs M103 and M104 constitute a current mirror circuit. The gate of an FET M105 is connected to the drains of the FETs M101 and M104, and the source to the high power supply terminal t5, and the drain to an output terminal t3 and to the drain of the FET M102. One end of a second constant-current source I102 is coupled with the drain and gate of the FET M108 and the other end to the low power Supply terminal t4.

Next, the operation of this differential amplifier will now be described.

First, the differential transistor pair composed of the FETs M101 and M102 distributes the current of the first constant-current source I101 depending on signal voltages applied to the input terminals t1 and t2 to flow a drain current. The current mirror circuit including the FETs M103 and M104 outputs a current which is fixed and equal to the current value determined by the second constant-current source I102 and hence the variation of the drain current of the FET M101 is transferred to the gate of the FET M105.

The variation of the drain current of the FET M101 is amplified by the FET M105 and the amplified current is output from the output terminal t3.

On the other hand, the variation of the drain current of the FET M102 turns to a value to negate the variation of the drain current of the FET M101 and is also picked up from the output terminal t3.

Hence, from the output terminal t3, the variation of the current largely amplified can be picked up and FIG. 1 discloses the differential amplifier having large voltage gain.

However, in the prior arts, although the conventional differential amplifier has the large voltage gain, the difference of the operating point voltage among the transistors causes a difference in a balance point operating current of the differential transistor pair and as a result, an input offset voltage occurs. That is, in the conventional differential amplifier shown in FIG. 1, the current value of the first constant-current source I101 is set to twice as much as that of the second constant-current source I102 and the same transistor is used for the FETs M103 and M104 so that the operating point current of the two FETs M101 and M102 constituting the differential pair may be equal.

However, in the conventional differential amplifier, since the voltages between the drain and source of the two FETs M103 and M104 of the current mirror circuit are largely different, the operating current is somewhat different in the transistors M103 and M104. Hence, the operating current turns out to be unequal in the two transistors M101 and M102 and as a result, an input offset voltage is caused between the input terminals t1 and t2. This offset voltage reaches several mV depending on the situation and thus the application of this circuit to a high accuracy device is restricted.

SUMMARY OF THE INVENTION

It is therefore an object of the present invention to provide a low offset differential amplifier having high gain in view of the aforementioned problems of the prior art, which is capable of reducing an offset voltage.

In accordance with one aspect of the present invention, there is provided a differential amplifier, comprising a current mirror circuit; a differential transistor pair including first and second transistors connected to first and second input terminals, respectively, for distributing current depending on signal voltages applied to the first and second input terminals; a first constant-current source for supplying the current to be distributed by the differential transistor pair, one end and another end of which are connected to the differential transistor pair and to a first power supply terminal, respectively: a third field-effect transistor whose drain and gate are coupled and whose source is connected to a second power supply terminal; and a fourth field-effect transistor whose gate, source and drain are connected to the gate and drain of the third field-effect transistor, to the second power supply terminal and to the first transistor, respectively: a fifth field-effect transistor whose gate, source and drain are connected to the first transistor and the drain of the fourth field-effect transistor, to the second power supply terminal and to an output terminal and the second transistor, respectively: a sixth transistor which is connected to the gate and drain of the third field-effect transistor and to a third power supply terminal, for equalizing a voltage between the drain and source of the third and fourth field-effect transistors; and a second constant-current source, one end and another end of which are connected to the sixth transistor and to the first power supply terminal, respectively.

In a preferable case, the first and second transistors of the differential transistor pair are field-effect transistors whose gates are connected to the respective first and second input terminals and whose sources are coupled in common with one end of the first power supply terminal, and a drain of the first field-effect transistor is connected to the drain of the fourth field-effect transistor. The drains of the first and fourth field-effect transistors are connected to the gate of the fifth field-effect transistor, and a drain of the second field-effect transistor is coupled with the output terminal and the drain of the fifth field-effect transistor. The sixth transistor is a field-effect transistor whose drain, source and gate are connected to the gate and drain of the third field-effect transistor, to one end of the second constant-current source and to the third power supply terminal, respectively.

In another preferable case, the first and second transistors of the differential transistor pair are bipolar transistors whose bases are connected to the respective first and second input terminals and whose emitters are coupled in common with one end of the first power supply terminal, and a collector of the first bipolar transistor is connected to the drain of the fourth field-effect transistor. The collector of the first bipolar transistor and the drain of the fourth field-effect transistor are connected to the gate of the fifth field-effect transistor, and a collector of the second bipolar transistor is coupled with the output terminal and the drain of the fifth field-effect transistor. The sixth transistor is a bipolar transistor whose collector whose collector, emitter and base are connected to the gate and drain of the third field-effect transistor, to one end of the second constant-current source and to the third power supply terminal, respectively.

In accordance with another aspect of the present invention, there is provided a differential amplifier, comprising a current mirror circuit: a differential transistor pair including first and second bipolar transistors whose emitters are coupled in common and whose bases are connected to first and second input terminals, respectively; a first constant-current source, one end and another end of which are connected to the common emitters of the first and second bipolar transistors of the differential transistor pair and to a first power supply terminal, respectively; a pair of third and fourth bipolar transistors whose bases are coupled in common with a second power supply terminal and whose emitters are connected to collectors of the respective first and second bipolar transistors; a first field-effect transistor whose drain and gate are coupled and whose source is connected to a third power supply terminal; and a second field-effect transistor whose gate source and drain are connected to the gate and drain of the first field-effect transistor, to the third power supply terminal and to a collector of the third bipolar transistor, respectively; a third field-effect transistor whose gate, source and drain are connected to the collector of the third bipolar transistor and the drain of the second field-effect transistor, to the third power supply terminal and to an output terminal and a collector of the fourth bipolar transistor, respectively: a fifth bipolar transistor whose collector and base are connected to the gate and drain of the first field-effect transistor and to the second power supply terminal, respectively; a sixth bipolar transistor whose collector and base are connected to an emitter of the fifth bipolar transistor and to a fourth power supply terminal, respectively; and a second constant-current source, one end and another end of which are connected to an emitter of the sixth bipolar transistor and to the first power supply terminal, respectively.

In accordance with a further aspect of the present invention, there is provided a differential amplifier, comprising a current mirror circuit: a differential transistor pair including first and second bipolar transistors whose emitters are coupled in common and whose bases are connected to first and second input terminals, respectively; a first constant-current source, one end and another end of which are connected to the common emitters of the first and second bipolar transistors of the differential transistor pair and to a first power supply terminal, respectively; a pair of third and fourth bipolar transistors whose bases are coupled in common with a second power supply terminal and whose emitters are connected to collectors of the respective first and second bipolar transistors: a fifth bipolar transistor whose collector and base are coupled and whose emitter is connected to a third power supply terminal; and a sixth bipolar transistor whose base, emmiter and collector are connected to the collector and base of the fifth bipolar transistor, to the third power supply terminal and to a collector of the third bipolar transistor, respectively; a seventh bipolar transistor whose base, emitter and collector are connected to the collectors of the third and sixth bipolar transistors, to the third power supply terminal and to an output terminal and a collector of the fourth bipolar transistor, respectively: an eighth bipolar transistor whose collector and base are connected to the collector and base of the fifth bipolar transistor and to the second power supply terminal, respectively; a ninth bipolar transistor whose collector and base are connected to an emitter of the eighth bipolar transistor and to a fourth power supply terminal, respectively: and a second constant-current source, one end and another end of which are connected to an emitter of the ninth bipolar transistor and to the first power supply terminal, respectively.

BRIEF DESCRIPTION OF THE DRAWINGS

The objects, features and advantages of the present invention will become more apparent from the consideration of the following detailed description taken in conjunction with the accompanying drawing in which.

DESCRIPTION OF THE PREFERRED EMBODIMENTS

Figure 1:
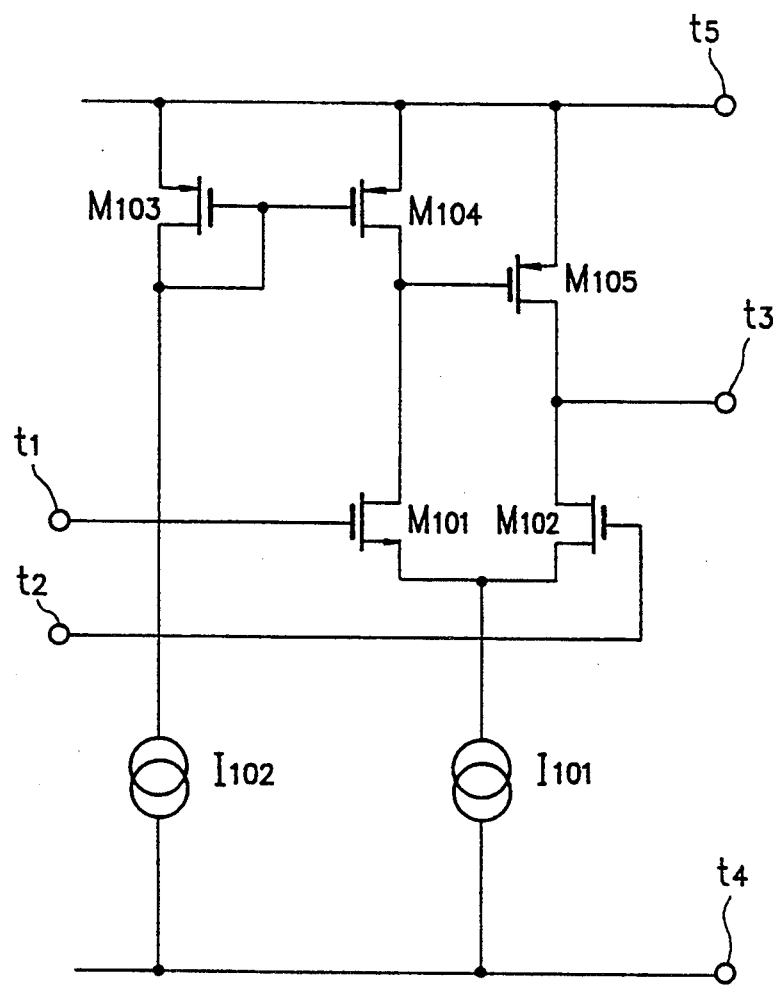
FIG. 1 is a circuit diagram of a conventional differential amplifier.

The present invention will now be described in connection with its preferred embodiments with reference to the accompanying drawings, wherein like reference characters designate like or corresponding parts throughout the views and thus the repeated description thereof can be omitted for brevity.

Figure 2:
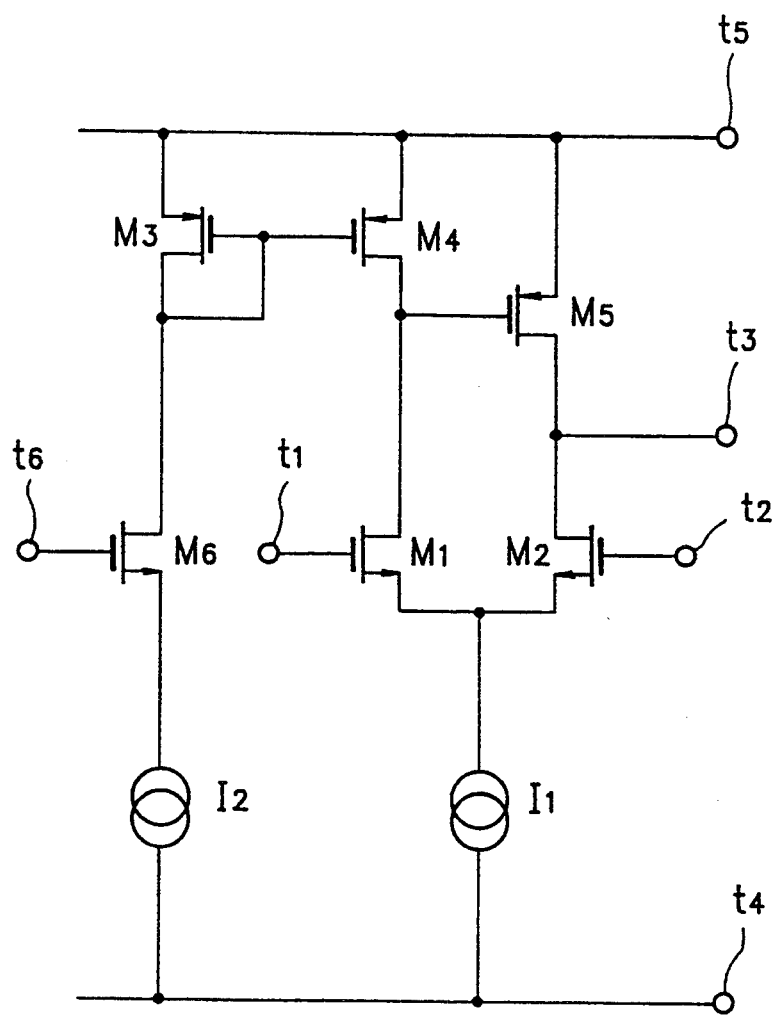
FIG. 2 is a circuit diagram of a first embodiment of a differential amplifier according to the present invention.

In FIG. 2, there is shown the first embodiment of a differential amplifier according to the present invention.

A differential transistor pair is composed of first and second FETs M1 and M2 whose sources are coupled with each other in common and whose gates are connected to first and second input terminals t1 and t2, respectively. One end of a first constant-current source I1 is connected to the common sources of the FETs M1 and M2 and the other end to a low power supply terminal t4. The drain and gate of a third FET M3 is coupled with each other and the source of the same is connected to a high power supply terminal t5. The gate of a fourth FET M4 is coupled with the gate of the third FET M3, and the source with the high power supply terminal t5, and the drain with the drain of the first FET M1. The third and fourth FETs M3 and M4 constitute a current mirror circuit.

The gate of a fifth FET M5 is connected to the drains of the first and fourth FETs M1 and M4, and the source to the high power supply terminal t5, and the drain to an output terminal t3 and to the drain of the second FET M2. The drain of a sixth FET M6 is connected to the drain of the third FET M3, and the gate to a bias power supply terminal t6. One end of a second constant-current source I2 is connected to the source of the sixth FET M6 and the other end of the same to the low power supply terminal t4.

Next, the operation of the aforementioned differential amplifier will now be described.

First, the differential transistor pair composed of the first and second FETs M1 and M2 distributes the current of the first constant-current source I1 depending on the signal voltages applied to the first and second input terminals t1 and t2 to flow the drain current. The current mirror circuit including the third and fourth FETs M3 and M4 outputs a current which is fixed and equal to the current value determined by the second constant-current source I2 and the sixth FET M6 and hence the variation of the drain current of the first FET M1 is transferred to the gate of the fifth FET M5.

The variation of the drain current of the first FET M1 is amplified by the fifth FET M5 and the amplified current is output from the output terminal t3.

On the other hand, the variation of the drain current of the second FET M2 turns to a value to negate the variation of the drain current of the first FET M1. That is, the drain current of the second FET M2 reduces in proportion to the increase of the drain current of the first FET M1.

Hence, when the output is taken out as the voltage from the output terminal t3, a voltage gain AV in a low frequency of the differential amplifier is obtained as follows:

$$AV = (\tfrac{1}{2}) \cdot gm1 \cdot \{ro1 \cdot ro4 \cdot ri5/(ro1 \cdot ro4 + ro4 \cdot ri5 + ri5 \cdot ro1)\} \cdot gm5 \cdot \{ro2 \cdot ro5/(ro2 + ro5)\} + (\tfrac{1}{2}) \cdot gm2 \cdot \{ro2 \cdot ro5/(ro2 + ro5)\}$$

wherein gm1, gm2 and gm5 represent transfer conductances of the first, second and fifth FETs M1, M2 and M5, respectively, and ro1, ro2, ro4 and ro5 represent output resistances of the first, second, fourth and fifth FETs M1, M2, M4 and M5, respectively, and ri5 represents an input resistance of the fifth FET M5.

For example, one calculation with numeric values is instantiated as follows:
when
  $gm1 = gm2 = 4 \times 10^{-3}$ [siemens],
  $gm5 = 2 \times 10^{-3}$ [siemens],
  $ro1 = ro2 = 500$ [k$\Omega$],
  $ro4 = ro5 = 200$ [k$\Omega$], and
  $ri = 100$ [k$\Omega$], $$AV = (\tfrac{1}{2}) \times 4 \times (1000 \times 17) \times 2 \times (1000/7) + (\tfrac{1}{2}) \times 4 \times (1000/7) \approx 33899 \text{ [times]} = 90.6 \text{ [dB]}$$

As described above, the differential amplifier shown in FIG. 2 has a very large voltage gain AV of approximately 91 [dB] in the low frequency.

Further, in this differential amplifier shown in FIG. 2 or the conventional differential amplifier shown in FIG. 1, in general, the current value of the first constant-current source I1 is determined to twice as much as that of the second constant-current source I2 and the same transistor is used for the third and fourth FETs M3 and M4 so that the operating point current of the first and second FETs M1 and M2 constituting the differential transistor pair may be equal.

In this embodiment, the insertion of the sixth FET M6 between the second constant-current source I2 and the pair of third and fourth FETs M3 and M4 of the current mirror circuit permits the voltages between the drain and source of the third and fourth FETs M3 and M4 to be nearly equal and hence the input offset voltage between the first and second input terminals t1 and t2 can be made nearly zero in the differential amplifier.

Figure 3:
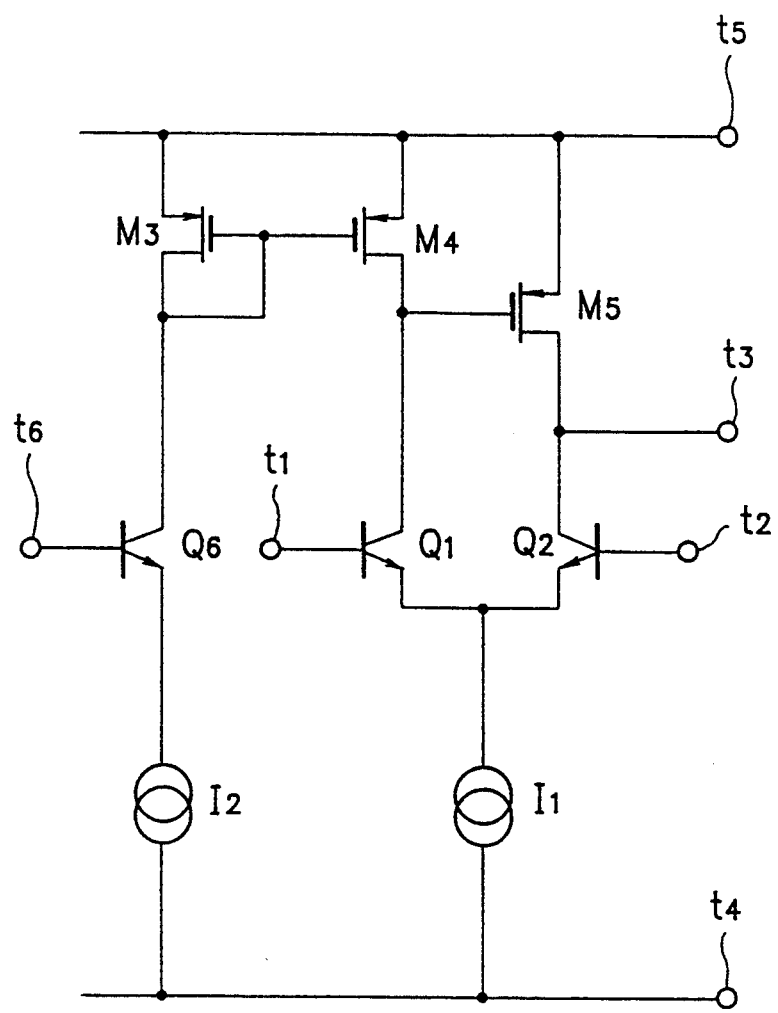
FIG. 3 is a circuit diagram of a second embodiment of a differential amplifier according to the present invention.

FIG. 3 shows the second embodiment of a differential amplifier according to the present invention.

In this embodiment, first, second and sixth bipolar transistors Q1, Q2 and Q6 are used in place of the respective first, second and sixth FETs M1, M2 and M6 of the first embodiment described above. In general, bipolar transistors have a better pair matching in integrated circuits than field-effect transistors. Thus, in this case, the input offset voltage can approach more close to zero.

Figure 4:
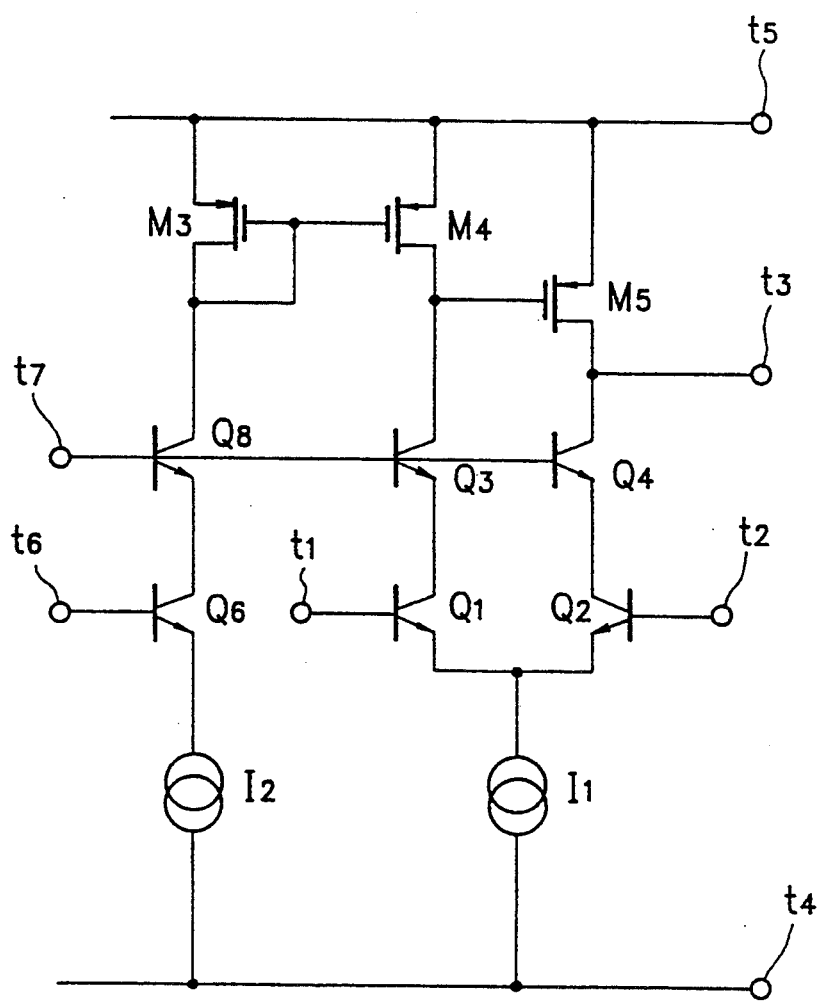
FIG. 4 is a circuit diagram of a third embodiment of a differential amplifier according to the present invention.

FIG. 4 illustrates the third embodiment of a differential amplifier according to the present invention.

In this embodiment, different from the second embodiment shown in FIG. 3, third, fourth and eighth bipolar transistors Q3, Q4 and Q8 whose bases are coupled with another bias power supply terminal t7 are inserted between the first bipolar transistor Q1 and the fourth FET M4, between the second bipolar transistor Q2 and the fifth FET M5, and between the sixth bipolar transistor Q6 and the third FET M3, respectively.

In this case, the addition of the pair of common base transistors Q3 and Q4 to the differential transistor pair of the first and second bipolar transistors Q1 and Q2 permits the increase of the voltage gain and further remarkable improvement against frequency characteristic degradation due to a Miller capacitance at the input terminal portions in addition to the effects obtained in the second embodiment shown in FIG. 3.

Figure 5:
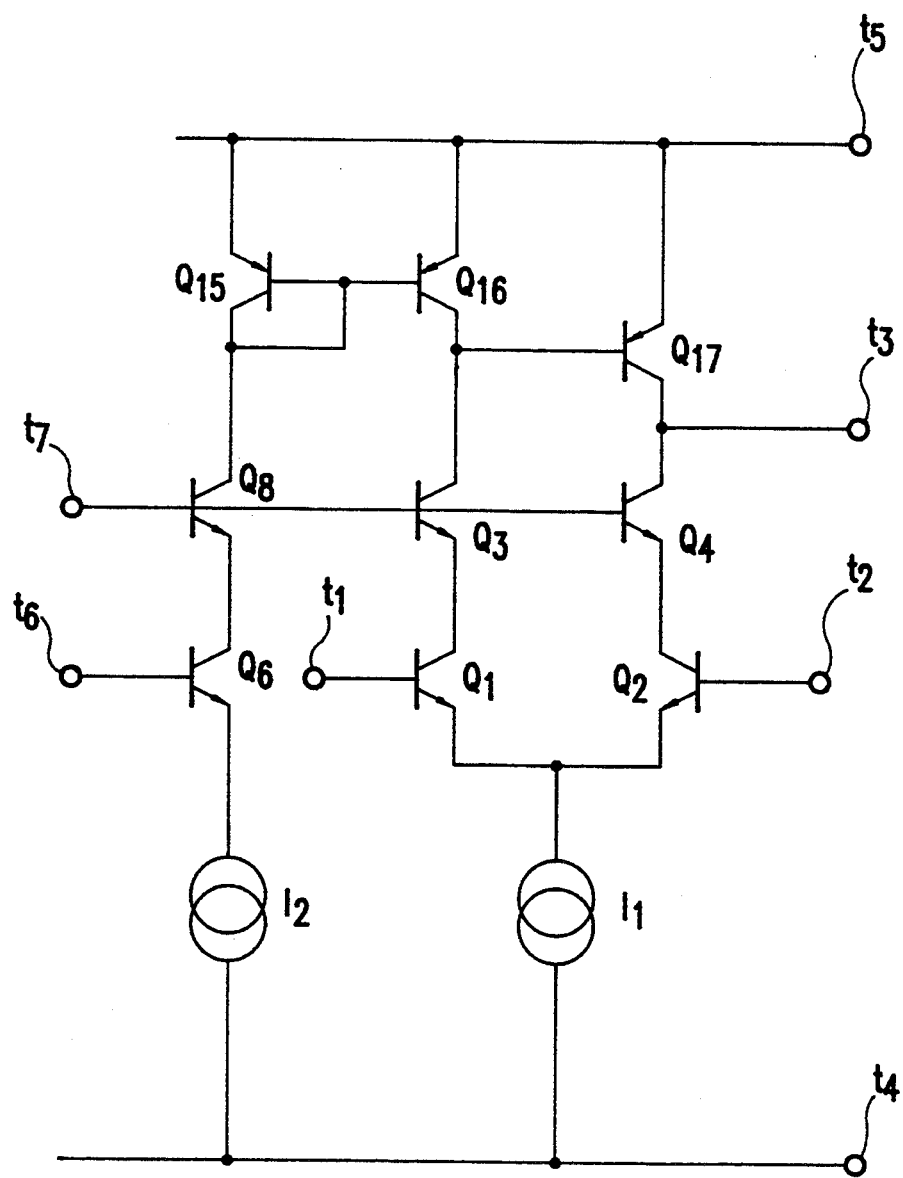
FIG. 5 is a circuit diagram of a fourth embodiment of a differential amplifier according to the present invention.

FIG. 5 shows the fourth embodiment of a differential amplifier according to the present invention.

In this embodiment, bipolar transistors Q15, Q16 and Q17 are used in place of the third, fourth and fifth FETs M3, M4 and M5 of the third embodiment shown in FIG. 4. In this case, the same effects as described above can also be obtained.

Although in the second and third embodiments shown in FIGS. 3 and 4, a bipolar-CMOS process is required in the production process of the integrated circuit and a producing cost rises, in the fourth embodiment, since the differential amplifier can be produced by a pure bipolar process, it is possible to provide a high gain, high speed, low offset differential amplifier at a lower cost.

Further, the bipolar transistors, the field-effect transistors and the constant-current sources can, of course, be arranged in the reversed polarity in the circuits shown in FIG. 2 to FIG. 5 with the same effects.

As described above, according to the present invention, a differential amplifier which has a large voltage gain at a low frequency signal input and is capable of reducing the input offset voltage of the conventional problem to nearly zero can be obtained and as a result, can be applied to a high accuracy signal processing circuit.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A differential amplifier, comprising:
   a differential transistor pair including first and second transistors connected to first and second input terminals, respectively, for distributing current depending on signal voltages applied to the first and second input terminals;
   a first constant-current source for supplying the current to be distributed by the differential transistor pair, one end and another end of which are connected to the differential transistor pair and to a first power supply terminal, respectively;
   a third field-effect transistor whose drain and gate are coupled and whose source is connected to a second power supply terminal;
   a fourth field-effect transistor whose gate, source and drain are connected to the gate and drain of the third field-effect transistor, to the second power supply terminal and to the first transistor, respectively;
   a fifth field-effect transistor whose gate, source and drain are connected to the first transistor and the drain of the fourth field-effect transistor, to the second power supply terminal and to an output terminal and the second transistor, respectively;
   a sixth transistor which is connected to the gate and drain of the third field-effect transistor and to a third power supply terminal, for equalizing a voltage between the drain and source of the third and fourth field-effect transistors; and
   a second constant-current source, one end and another end of which are connected to the sixth transistor and to the first power supply terminal, respectively.

2. The differential amplifier as claimed in claim 1, wherein the first and second transistors of the differential transistor pair are field-effect transistors whose gates are connected to the respective first and second input terminals and whose sources are coupled in common with one end of the first constant-current source, and a drain of the first field-effect transistor is connected to the drain of the fourth field-effect transistor: wherein the drains of the first and fourth field-effect transistors are connected to the gate of the fifth field-effect transistor, and a drain of the second field-effect transistor is coupled with the output terminal and the drain of the fifth field-effect transistor; and wherein the sixth transistor is a field-effect transistor whose drain, source and gate are connected to the gate and drain of the third field-effect transistor, to one end of the second constant-current source and to the third power supply terminal, respectively.

3. The differential amplifier as claimed in claim 1, wherein the first and second transistors of the differential transistor pair are bipolar transistors whose bases are connected to the respective first and second input terminals and whose emitters are coupled in common with one end of the first constant-current source, and a collector of the first bipolar transistor is connected to the drain of the fourth field-effect transistor; wherein the collector of the first bipolar transistor and the drain of the fourth field-effect transistor are connected to the gate of the fifth field-effect transistor, and a collector of the second bipolar transistor is coupled with the output terminal and the drain of the fifth field-effect transistor; and wherein the sixth transistor is a bipolar transistor whose collector, emitter and base are connected to the gate and drain of the third field-effect transistor, to one end of the second constant-current source and to the third power supply terminal, respectively.

4. A differential amplifier, comprising:
   a differential transistor pair including first and second bipolar transistors whose emitters are coupled in common and whose bases are connected to first and second input terminals, respectively;
   a first constant-current source, one end and another end of which are connected to the common emitters of the first and second bipolar transistors of the differential transistor pair and to a first power supply terminal, respectively;
   a pair of third and fourth bipolar transistors whose bases are coupled in common with a second power supply terminal and whose emitters are connected to collectors of the respective first and second bipolar transistors;
   a first field-effect transistor whose drain and gate are coupled and whose source is connected to a third power supply terminal;
   a second field-effect transistor whose gate, source and drain are connected to the gate and drain of the first field-effect transistor, to the third power supply terminal and to a collector of the third bipolar transistor, respectively;
   a third field-effect transistor whose gate, source and drain are connected to the collector of the third bipolar transistor and the drain of the second field-effect transistor, to the third power supply terminal and to an output terminal and a collector of the fourth bipolar transistor, respectively;
   a fifth bipolar transistor whose collector and base are connected to the gate and drain of the first field-effect transistor and to the second power supply terminal, respectively;
   a sixth bipolar transistor whose collector and base are connected to an emitter of the fifth bipolar transistor and to a fourth power supply terminal, respectively; and
   a second constant-current source, one end and another end of which are connected to an emitter of the sixth bipolar transistor and to the first power supply terminal, respectively.

5. A differential amplifier, comprising:
   a differential transistor pair including first and second bipolar transistors whose emitters are coupled in common and whose bases are connected to first and second input terminals, respectively;
   a first constant-current source, one end and another end of which are connected to the common emitters of the first and second bipolar transistors of the differential transistor pair and to a first power supply terminal, respectively;
   a pair of third and fourth bipolar transistors whose bases are coupled in common with a second power supply terminal and whose emitters are connected to collectors of the respective first and second bipolar transistors;
   a fifth bipolar transistor whose collector and base are coupled and whose emitter is connected to a third power supply terminal;
   a sixth bipolar transistor whose base, emitter and collector are connected to the collector and base of the fifth bipolar transistor, to the third power supply terminal and to a collector of the third bipolar transistor, respectively;

a seventh bipolar transistor whose base, emitter and collector are connected to the collectors of the third and sixth bipolar transistors, to the third power supply terminal and to an output terminal and a collector of the fourth bipolar transistor, respectively;

an eighth bipolar transistor whose collector and base are connected to the collector and base of the fifth bipolar transistor and to the second power supply terminal, respectively;

a ninth bipolar transistor whose collector and base are connected to an emitter of the eighth bipolar transistor and to a fourth power supply terminal, respectively;r3 and a second constant-current source, one end and another end of which are connected to an emitter of the ninth bipolar transistor and to the first power supply terminal, respectively.

* * * * *